(12) United States Patent
Choi et al.

(10) Patent No.: US 6,198,661 B1
(45) Date of Patent: Mar. 6, 2001

(54) SENSING CIRCUIT FOR SEMICONDUCTOR DEVICE AND SENSING METHOD USING THE SAME

(75) Inventors: Woong Lim Choi, Chungcheongbuk-do; Dae Mann Kim; Si Bum Jun, both of Kyungsangbuk-do, all of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/371,042

(22) Filed: Aug. 10, 1999

(30) Foreign Application Priority Data

Nov. 26, 1998  (KR) .................................................. 98-50970

(51) Int. Cl.[7] .................................................. G11C 16/06
(52) U.S. Cl. .................................. 365/185.21; 365/185.2
(58) Field of Search ................................... 365/205, 207, 365/208, 185.2, 185.21

(56) References Cited

U.S. PATENT DOCUMENTS

| | | | |
|---|---|---|---|
| 5,327,379 | | 7/1994 | Pascucci ................................ 365/190 |
| 5,438,287 | | 8/1995 | Faue ...................................... 327/54 |
| 5,544,114 | * | 8/1996 | Gaultier et al. ........................ 365/202 |
| 5,661,684 | * | 8/1997 | Wong et al. ...................... 365/185.21 |
| 5,798,967 | * | 8/1998 | Sarin et al. ....................... 365/185.21 |
| 5,805,500 | * | 9/1998 | Campardo et al. ............... 365/185.2 |
| 5,901,087 | * | 5/1999 | Pascucci .......................... 365/185.21 |
| 5,936,888 | * | 8/1999 | Sugawara ......................... 365/185.2 |
| 5,986,937 | * | 11/1999 | Yero ................................. 365/185.21 |

* cited by examiner

Primary Examiner—Son Mai
(74) Attorney, Agent, or Firm—Fleshner & Kim, LLP

(57) ABSTRACT

Sensing circuit for a semiconductor device and a sensing method using the same which allows sensing of a selected nonvolatile memory cell at a low voltage, a low power, and a fast speed, and has a high sensing reliability, the circuit including a bitline connected to a drain terminal of a memory cell through a Y-decoder, a senseline for sensing, and forwarding a data in the memory cell, a switching unit for switching between the bitline and the senseline, a first current supply unit disposed between a power source and the bitline for supplying a current to the bitline to the memory cell, a second current supply unit disposed between the power source and the senseline for supplying a current to the senseline, a voltage level shifter for providing a voltage difference between the bitline and the senseline, and a sense MOS transistor disposed between the senseline and the ground voltage and having a gate terminal connected to one end of the voltage level shifter.

15 Claims, 9 Drawing Sheets

SENSING CIRCUIT FOR SEMICONDUCTOR DEVICE AND SENSING METHOD USING THE SAME

BACKGROUND OF THE INVENTION

1. Field of the Invention

The present invention relates to a semiconductor memory, and more particularly, to a sensing circuit for a semiconductor device and a sensing method using the same, which allows sensing of a selected nonvolatile memory cell at a low voltage, a low power, and a fast speed, and has a high sensing reliability.

2. Background of the Related Art

A related art sensing circuit for a semiconductor device will be explained with reference to the attached drawings. FIG. 1 illustrates a first exemplary related art sensing circuit for a semiconductor memory, and FIG. 2 illustrates a second exemplary related art sensing circuit for a semiconductor memory.

Referring to FIG. 1, the first exemplary related art sensing circuit for a semiconductor memory is provided with a memory cell(for example, a nonvolatile EEPROM) connected to, and selected both by a wordline and a bitline, a bitline capacitor Cb1 parasitically present between the bitline and a ground voltage terminal Vss, a Y-decoder between the bitline to the memory cell and a sensing node, a PMOS transistor between a source voltage terminal and the sensing node responsive to a reference voltage Vref(or a bias voltage Vbias), and a buffer for sensing a signal from the sensing node.

Referring to FIG. 2, the second exemplary related art sensing circuit for a semiconductor memory is provided with a memory cell(for example, a nonvolatile EEPROM) selected both by a wordline and a Y-decoder connected to a bitline, a bitline capacitor Cb1 parasitically present between the bitline and a ground voltage terminal Vss, the Y-decoder and a voltage clamping unit connected in series between the bitline of the memory cell and the sensing node, PMOS transistor between a source voltage terminal Vdd and the sensing node having a gate terminal connected to a drain terminal, a comparing unit for comparing a voltage on the sensing node to a reference voltage Vref. The voltage clamping unit, provided for clamping a bitline voltage, is provided with a buffer for forwarding a signal decoded in the Y-decoder and an NMOS transistor responsive to the buffer output.

The operations of the aforementioned related art sensing circuits for a semiconductor memory will be explained.

Referring to FIG. 1, in the first exemplary related art sensing circuit for a semiconductor memory, the reference voltage is applied to the bitline to the memory cell, for sensing a programmed, or erased state by boosting or dropping a bitline voltage. In the erased state, the channel has a low Vth to allow an adequate current flow when a $V_{W/L}$ is applied. And, in the programmed state, the channel has a high Vth not to allow a current flow when a $V_{W/L}$ is applied. For example, when the memory cell is at an erased state, i.e., when the memory cell has a low Vth, upon application of a voltage of $V_{W/L}$ to the memory cell selected by the Y-decoder, a 'high' level is sensed due to drop of the sensing node voltage caused by flow of a current greater than the reference current flowing into the sensing node through the PMOS transistor coming from the low Vth. A value of a memory cell voltage level is provided. Opposite to this, when the memory cell is programmed, a 'low' level value is provided.

In the second exemplary related art sensing circuit for a semiconductor memory provided for supplementing drop of a sensing reliability due to changed bitline voltage caused by a memory cell current during sensing operation in the first exemplary related art sensing circuit for a semiconductor memory, the bitline to the memory cell selected by the Y-decoder is adjusted of its voltage to an arbitrary level through a negative feed back loop, i.e., a voltage clamping unit, a cell current flowing through a selected bitline is converted into a voltage form, and compared with a reference voltage using a comparing unit, to sense a memory cell state. For example, when the memory cell is at an erased state, the NMOS transistor in the voltage clamping unit is turned on and quickly becomes responsive to the sensing node, because current is drained through the memory cell, a voltage lower than the reference voltage Vref is generated, and, accordingly, a value at the sensing node is compared to the reference value, to provide a 'high' sensing value. Opposite to this, when the memory cell is programmed, the NMOS transistor in the voltage clamping unit is turned off, to generate a voltage Vdd−$|V_{THP}|$, providing a 'low' sensing value through the comparing unit.

However, the related art sensing circuits for a semiconductor memory have the following problems.

First, there have been a problem of soft programming caused by a relatively high voltage applied to a bitline in sensing a memory cell state, and problems of power consumption and a speed drop caused by charging and discharging of a bitline capacitance due to a great voltage swing.

Second, despite the comparatively low voltage level clamping of the bitline voltage in the second exemplary related art sensing circuit for a semiconductor memory, the second exemplary related art sensing circuit for a semiconductor memory is involved in additional power consumption due to the reduced cell current and increased components, has difficulty in embodiment of the same in an environment requiring a low voltage and a low power, and has a low fabrication process reproducibility.

SUMMARY OF THE INVENTION

Accordingly, the present invention is directed to sensing circuit for a semiconductor device and a sensing method using the same that substantially obviates one or more of the problems due to limitations and disadvantages of the related art.

An object of the present invention is to provide sensing circuit for a semiconductor device and a sensing method using the same which allows sensing of a nonvolatile memory cell selected by Y-decoder at a low voltage, a low power, and a fast speed, and has a high sensing reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the sensing circuit for a semiconductor device includes a bitline connected to a drain terminal of a memory cell through a Y-decoder, a senseline for sensing, and forwarding a data in the memory cell, a switching unit for switching between the bitline and the senseline, a first current supply unit disposed between a power source and the bitline for supplying a current to the bitline to the memory cell, a second current supply unit disposed between the power source and the senseline for supplying a current to the senseline, a voltage level shifter for providing a voltage difference between the bitline and the senseline, and a sense MOS transistor disposed between the senseline and the ground voltage and having a gate terminal connected to one end of the voltage level shifter.

The voltage level shifter is provided for an adequate turning on of the sense MOS transistor, and has a voltage difference to a range of the threshold voltage of the sense MOS transistor.

In other aspect of the present invention, there is provided a sensing method using a sensing circuit for a semiconductor memory including the steps of (1) applying a voltage to a selected memory cell at a wordline thereof, (2) turning on a switch to connect a bitline to a senseline for precharging the bitline to the selected memory cell, and (3) turning off the switch for using a voltage change at a sensing node caused by a threshold voltage difference of the selected memory cell in sensing a data in the selected memory cell.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 5a illustrates an equivalent circuit for the sensing circuit shown in FIG. 4 when the switching unit is turned on;

DETAILED DESCRIPTION OF THE PREFERRED EMBODIMENT

Figure 1:
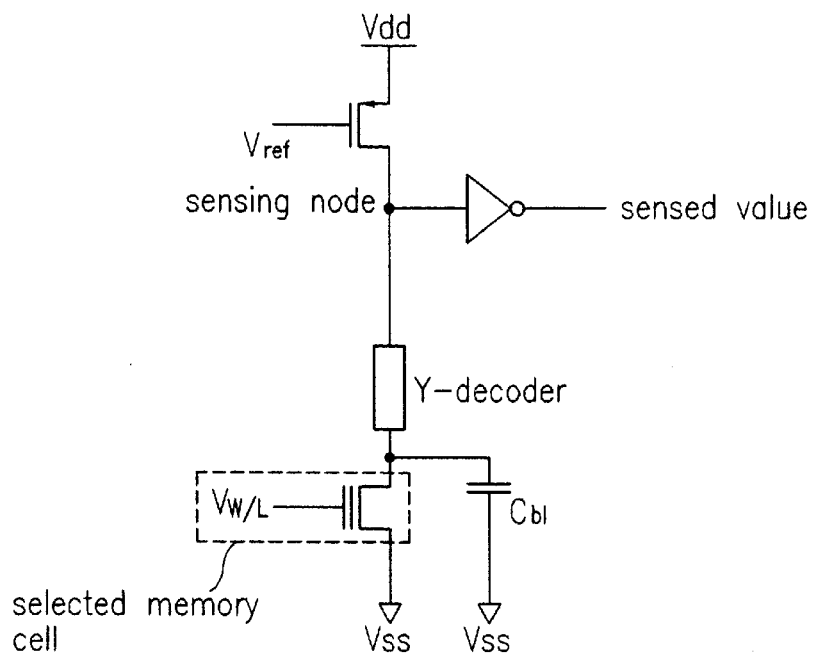
FIG. 1 illustrates a first exemplary related art sensing circuit for a semiconductor memory.
Figure 2:
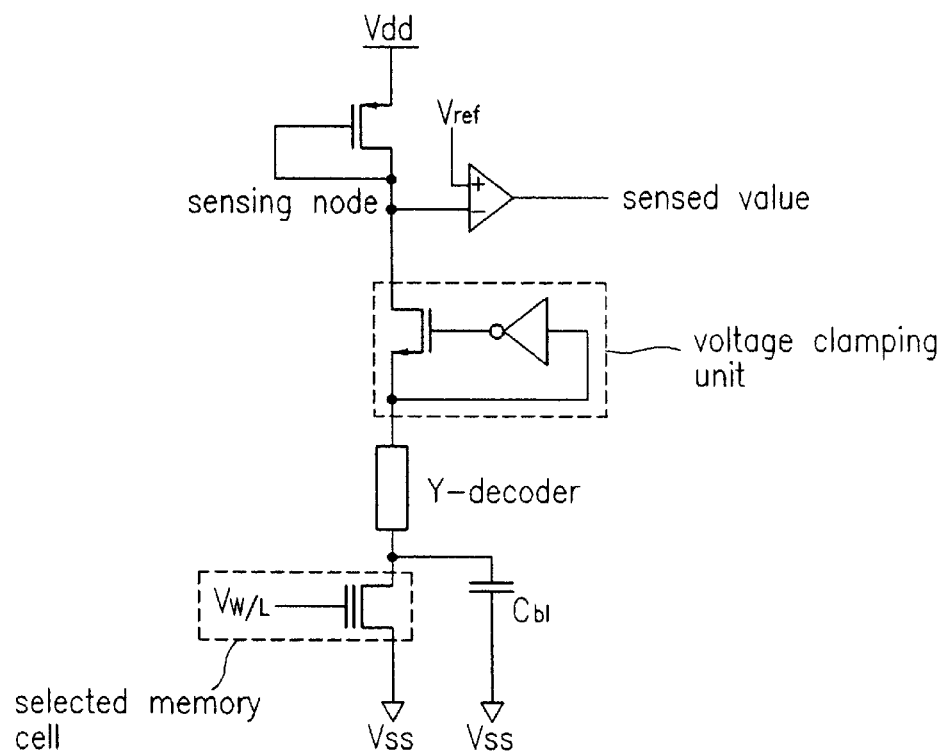
FIG. 2 illustrates a second exemplary related art sensing circuit for a semiconductor memory.
Figure 3:
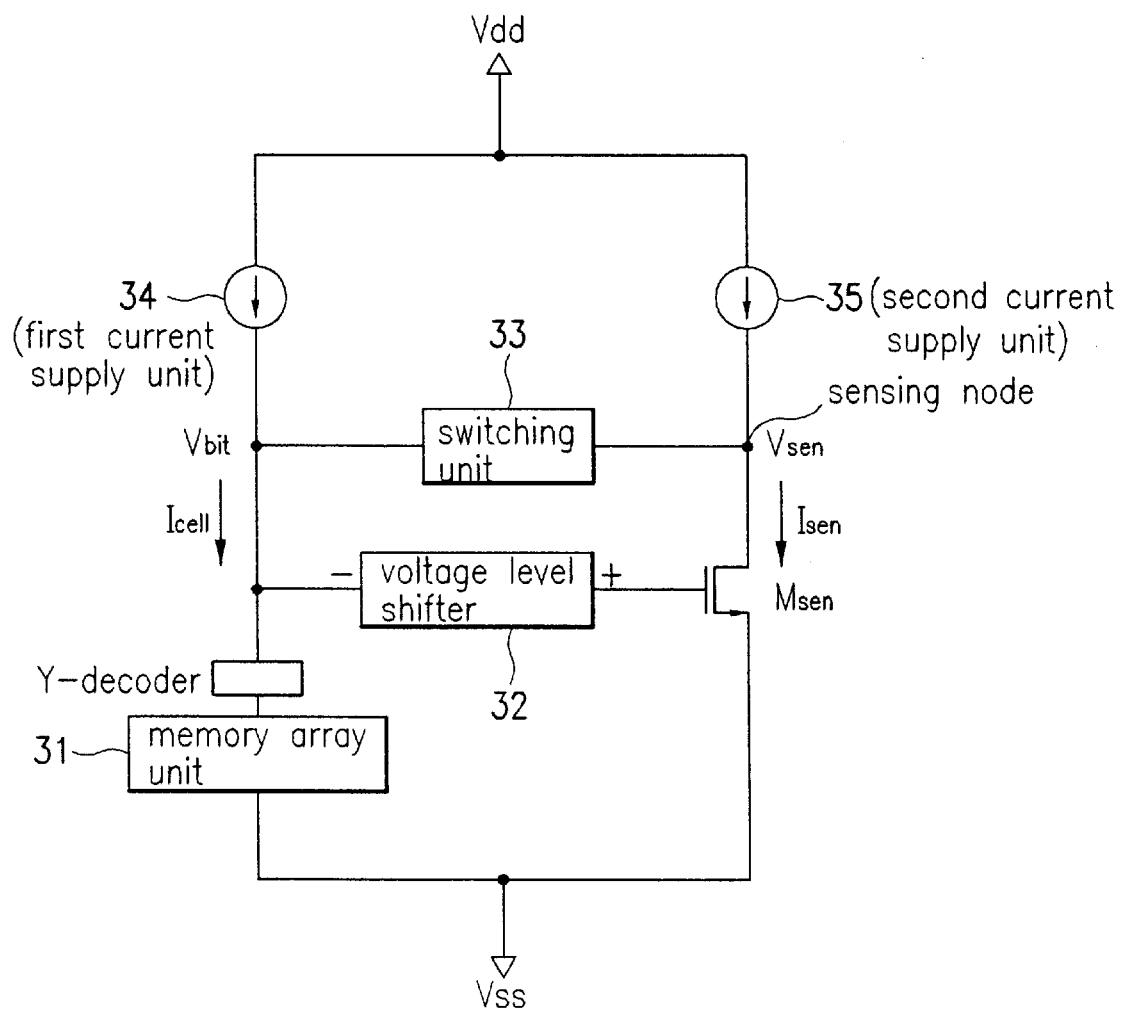
FIG. 3 illustrates a block diagram showing a system of a sensing circuit for a semiconductor memory in accordance with a preferred embodiment of the present invention.

Reference will now be made in detail to the preferred embodiments of the present invention, examples of which are illustrated in the accompanying drawings. The memory of the present invention may be a nonvolatile memory, an EPROM, or a flash EEPROM. FIG. 3 illustrates a block diagram showing a system of a sensing circuit for a semiconductor memory in accordance with a preferred embodiment of the present invention, FIG. 4 illustrates a symbolic representation of a system of the sensing circuit for a semiconductor memory shown in FIG. 3, and FIG. 5a illustrates an equivalent circuit for the sensing circuit shown in FIG. 4 when the switching unit is turned on.

Referring to FIG. 3, the sensing circuit for a semiconductor memory in accordance with a preferred embodiment of the present invention includes a memory array unit 31 having a plurality of wordlines, a plurality of bitlines, and a plurality of memory cells, a first current supply unit 34 provided between a source voltage terminal Vdd and a bitline of a memory cell selected by a Y-decoder in the memory array unit 31 for supplying a current to the bitline, a switching unit 33 for connecting the bitline of the memory cell selected by the Y-decoder and a sensing node, a voltage level shifter 32 for boosting a voltage level of the bitline and applying to a gate of Msen, a sense MOS transistor Msen between the sensing node and a ground voltage terminal Vss having a gate electrode connected to one end of the voltage level shifter 32, and a second current supply unit 35 between the source voltage terminal Vdd and the sensing node for supplying a current to the sensing node. The voltage level shifter 32 has a negative(−) terminal connected to the bitline to the memory cell selected by the Y-decoder and a positive (+) terminal connected to a gate electrode of the sense MOS transistor Msen.

Figure 4:
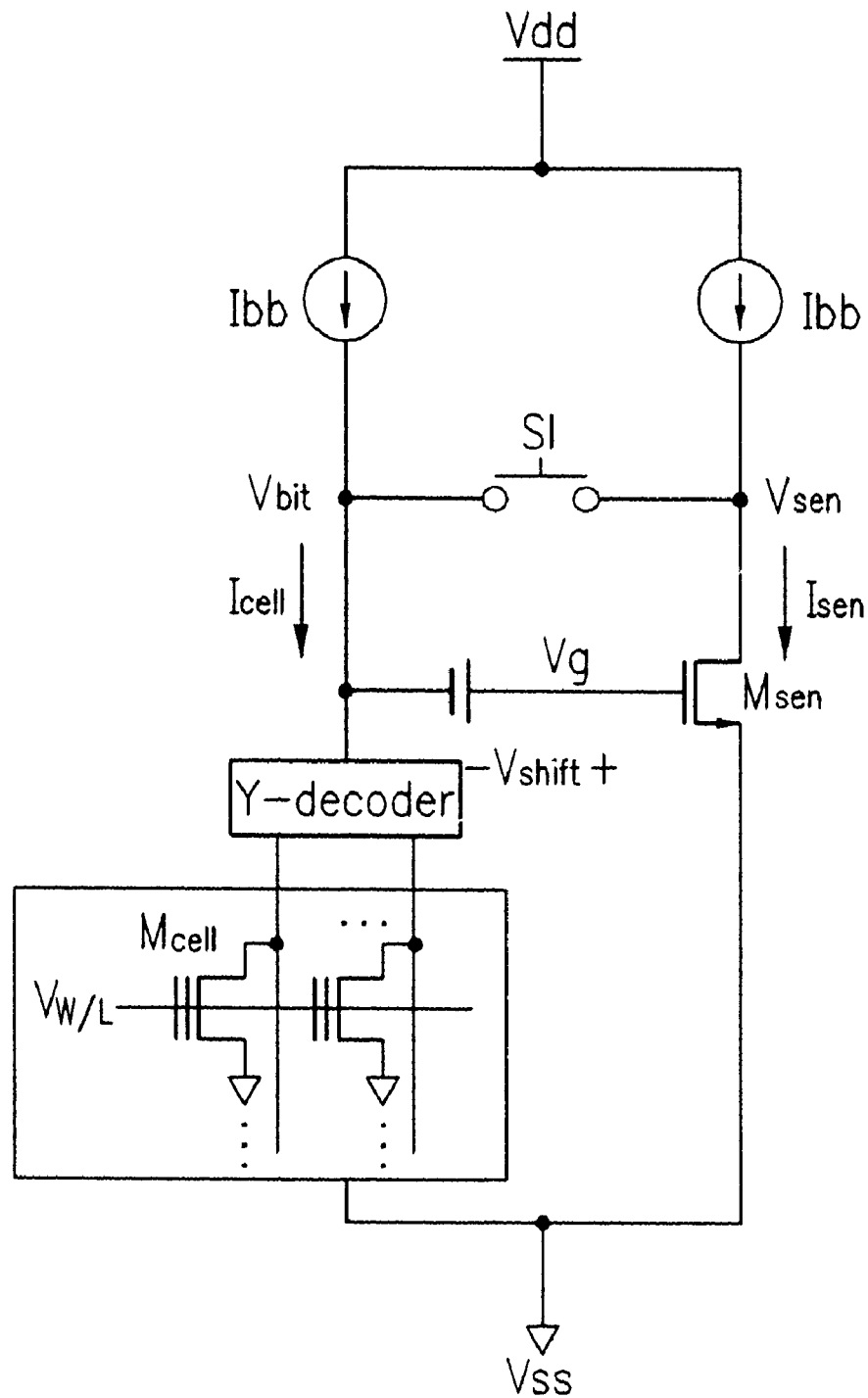
FIG. 4 illustrates a symbolic representation of a system of the sensing circuit for a semiconductor memory shown in FIG. 3.
Figure 5A:
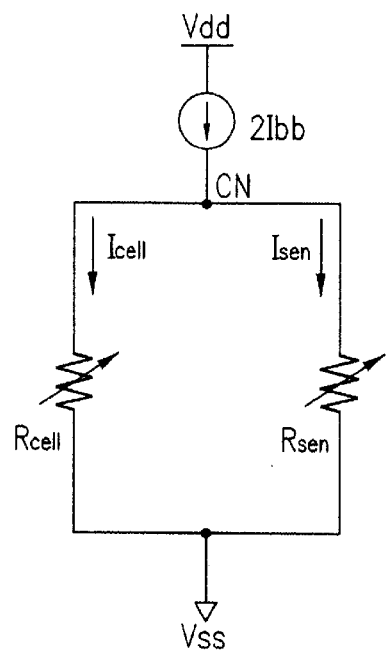

Referring to FIG. 4, the sensing circuit for a semiconductor memory in accordance with a preferred embodiment of the present invention may be represented with simple symbols; the switching unit 33 may be represented with a an ON/OFF switch S1 symbol, the voltage level shifter 32 may be represented with a cell symbol with positive and negative terminals, and the first and second current supply units 34 and 35 each with a current value of Ibb. FIG. 5a illustrates an equivalent circuit for the sensing circuit shown in FIG. 4 when the switching unit S1 is turned on and both the memory cell Mcell and the sense MOS transistor Msen are represented with variable resistors, respectively. Each of the variable resistors is a channel resistance which is sensitive to a threshold voltage. That is, when the switch S1 is turned on, the first, and second current supplies 34 and 35 are combined together to represent them with a current supply unit with a 2Ibb current flowing therethrough. And, a contact node CN connected to the current supply and the ground voltage terminal Vss form a closed circuit. In the closed circuit, there are a current of Icell and a variable resistor of Rcell between one side of the contact node and the ground voltage terminal and a current of Isen and a variable resistor of Rsen between the other side of the contact node and the ground voltage terminal.

Figure 5B:
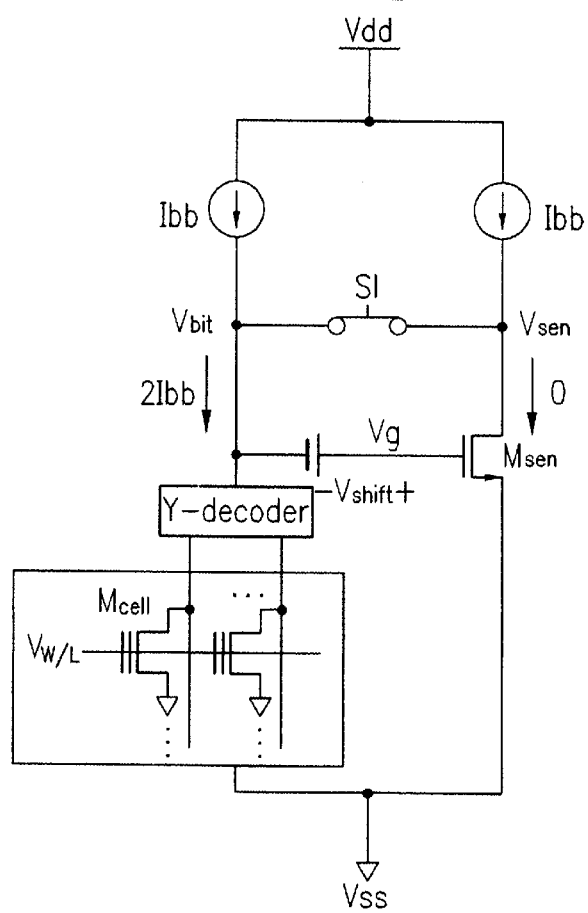
FIG. 5b illustrates a circuit when an erased cell is precharged.
Figure 5C:
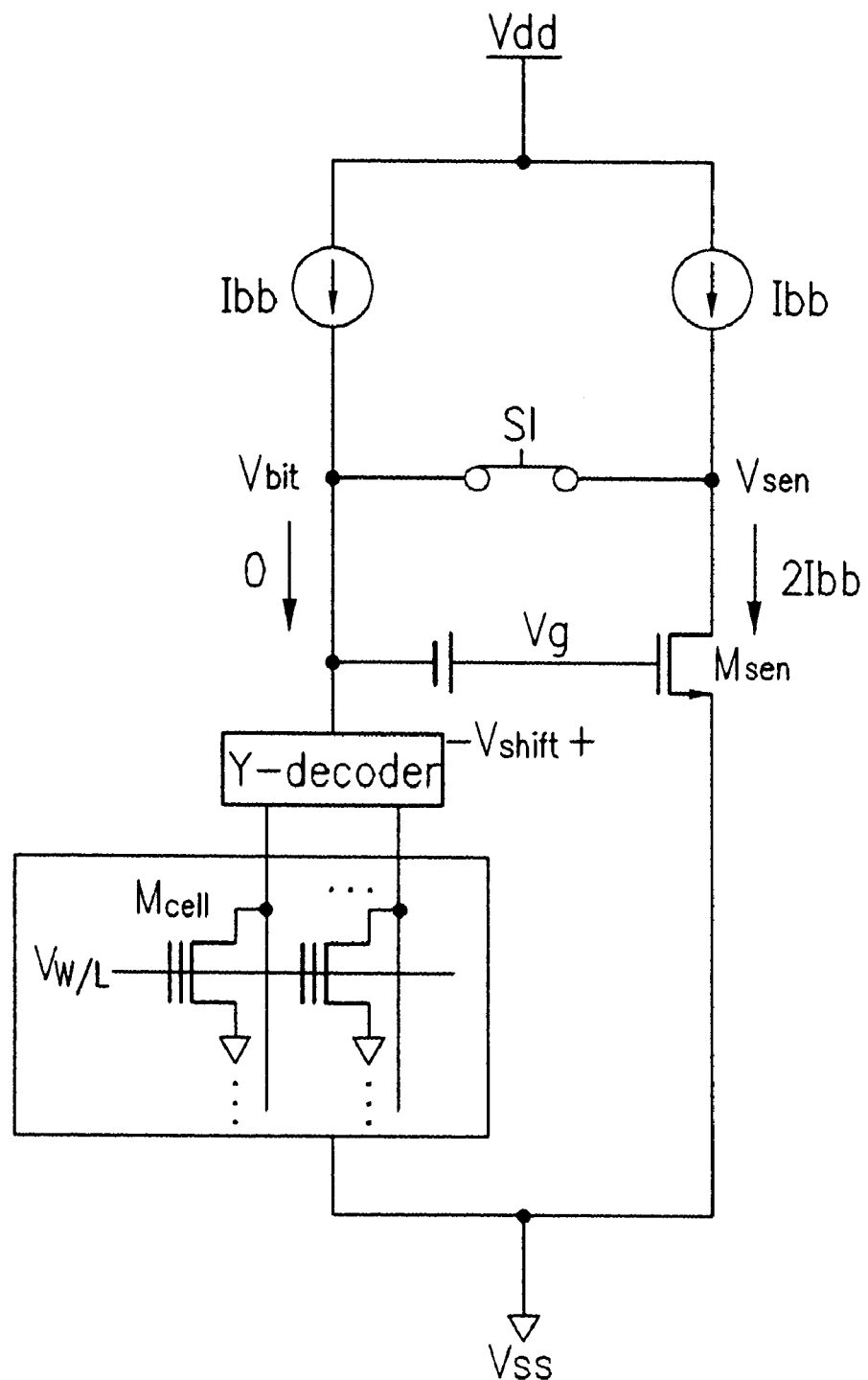
FIG. 5c illustrates a circuit when a programmed cell is precharged.
Figure 6:
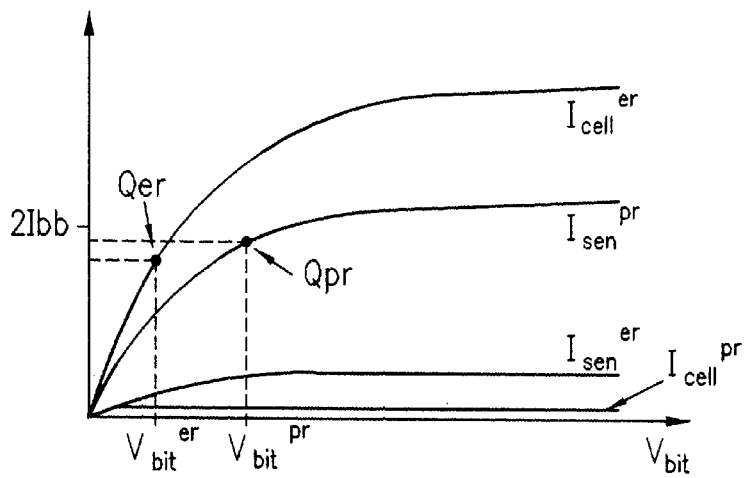
FIG. 6 illustrates a graph showing operation points of a circuit in the precharge operation.
Figure 9A:
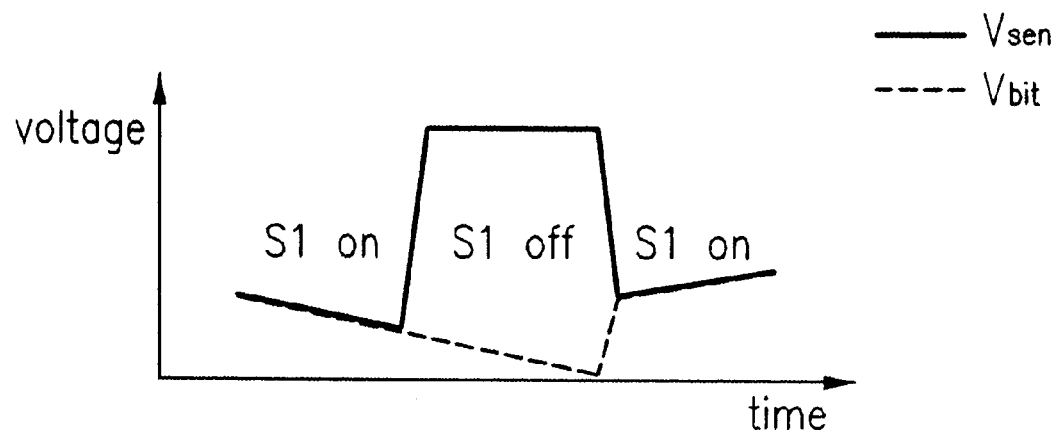
FIG. 9a illustrates voltage waveforms at a sensing node and a bitline in precharge operation and sensing operation of an erased cell.
Figure 9B:
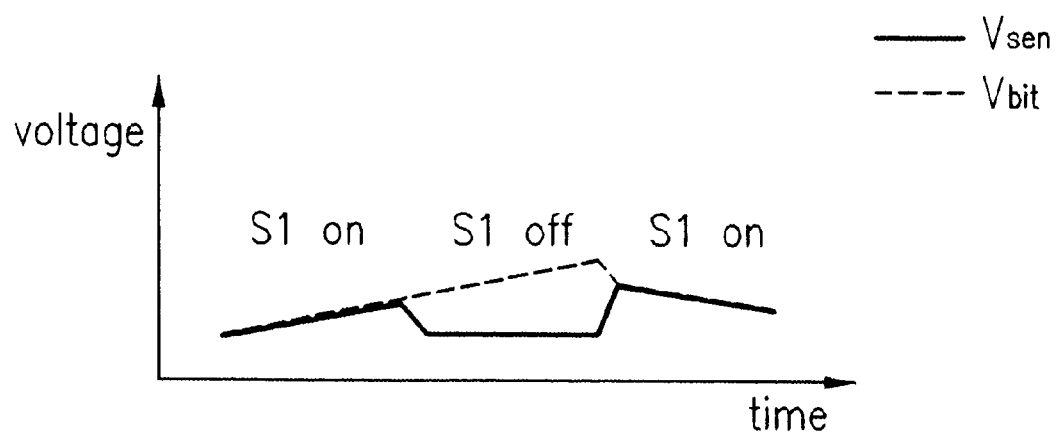
FIG. 9b illustrates voltage waveforms at a sensing node and a bitline in precharge operation and sensing operation of a programmed cell; and, FIG. 10 illustrates a sensing circuit for a semiconductor memory of the present invention provided for actual application.

The sensing operation using the sensing circuit for a semiconductor memory of the present invention shown in FIG. 4 will be explained. FIG. 5b illustrates a circuit when an erased cell is precharged, and FIG. 5c illustrates a circuit when a programmed cell is precharged. FIG. 9a illustrates voltage waveforms at a sensing node and a bitline in precharge operation and sensing operation of an erased cell, and FIG. 9b illustrates voltage waveforms at a sensing node and a bitline in precharge operation and sensing operation of a programmed cell. FIG. 6 illustrates a graph showing operation points of a circuit in the precharge operation of an erased cell and a programmed cell. In this instance, as the bitline and the senseline are electrically combined by S1, the bitline and the senseline have the same voltage. The circuit shown in FIG. 4 makes a precharge operation or a sensing operation depending on a state of the switch S1; if the switch S1 turns on, the circuit makes a precharge operation and, if the switch S1 turns off, the circuit makes a sensing operation.

Different from the sense MOS transistor Msen, the threshold voltage stored in a selected memory cell in the memory array unit 31 is variable with the stored data, and the channel resistance is sensitive to the threshold voltage of the memory cell. That is, if the threshold voltage is low, the channel resistance is low, and if the threshold voltage is high, the channel resistance is high. In a programmed state, a cell has a threshold voltage high enough to block flow of a channel current when a wordline voltage is applied. And, in an erased state, the flow of channel current is great when the same wordline voltage is applied. To sense a state of the memory cell, the switch S1 is turned on to precharge, and, then, the switch S1 is turned off to read a voltage change of the sensing node.

First, the precharge operation in which the switch S1 is turned on will be explained. Since the precharge operations for an erased cell and a programmed cell are different, the precharge operations will be explained, separately. First, as shown in FIGS. 4, and 5a~5b, in the case of an erased cell, that is, when a channel resistance Rcell of the memory cell Mcell is substantially lower than a channel resistance Rsen of a sense MOS transistor Msen(Rcell<Rseb), most of 2Ibb which is a sum of the first, and second current supply units 34 and 35 flows through the memory cell which has a lower channel resistance. That is Icell=2Ibb, and Isen=0.(Icell is a current flowing through the memory cell Mcell, and the Isen is a current flowing through a sense MOS transistor Msen). It can be known that the reason most of 2Ibb flows through the memory cell comes from a relation between the channel resistance and the threshold voltage. That is, in the case of erased memory cell, the low threshold voltage leads to have a very low channel resistance, with a small voltage difference between both ends of the channel caused by the 2Ibb. Therefore, a gate voltage Vg of the sense MOS transistor Msen connected to voltage and cell between both ends of the channel is substantially the same with a voltage difference of the cell, which is almost the same with the threshold voltage of the sense MOS transistor, it is difficult a current to flow through the sense MOS transistor. In this instance, the gate voltage of the sense MOS transistor is denoted as $Vg^{er}$.

Secondly, as shown in FIGS. 4, and 5a~5c, in the case of the programmed cell, i.e., when Rcell>Rsen, most of the 2Ibb which is a sum of currents from the first, and second current supply units 34 and 35 flows to the sense MOS transistor Msen. That is, Icell=0, and Isen=2Ibb. In this instance, most of the 2Ibb flows to the sense MOS transistor Msen because the programmed memory cell has a very high channel resistance Rcell and a Vg fixed as a value which can turn on the sense MOS transistor. A gate voltage of the sense MOS transistor of this instance is denoted as $Vg^{pr}$.

FIG. 6 illustrates a graph showing operation points at the memory cell Mcell and the sense MOS transistor Msen in a circuit in a precharge operation for a erased cell and a programmed cell, wherein $Icell^{er}$ and $Icell^{pr}$ are currents flowing through the erased cell and the programmed cell respectively, and $Isen^{er}$ and $Isen^{pr}$ are current flowing through the sense MOS transistor when the memory cell is erased and programmed.

Referring to FIG. 6, it can be known that, when the erased cell is precharged, most of the current flows through the memory cell, and when the programmed cell is precharged, most of the current flows through the sense MOS transistor Msen. And, in case of erased cell, a precharge operation point of the memory cell is $Q^{er}$, and, in case of programmed cell, a precharge operation point of the sense MOS transistor Msen is $Q^{pr}$. In this instance, each operation point is at a time when a bitline voltage at a contact node CN(see FIG. 5a) is $Vbit^{er}$ and $Vbit^{pr}$ with a current of 2Ibb. It is assumed that a leakage current of not '0', but a small amount flows through the programmed cell. As shown in FIGS. 6, and 9a~9b, both a bitline voltage $Vbit^{er}$ at $Q^{er}$ and a bitline voltage $Vbit^{pr}$ at $Q^{pr}$ are small and has a very small difference. And, when the erased cell and the programmed cell are precharged(when the switch S1 is turned on), the bitline voltage Vbit and the sensing node voltage Vsen vary in the same fashion.

The sensing operations of the erased cell and the programmed cell when the switch is turned off after the erased cell and the programmed cell finish their precharge operation will be explained.

Figure 7:
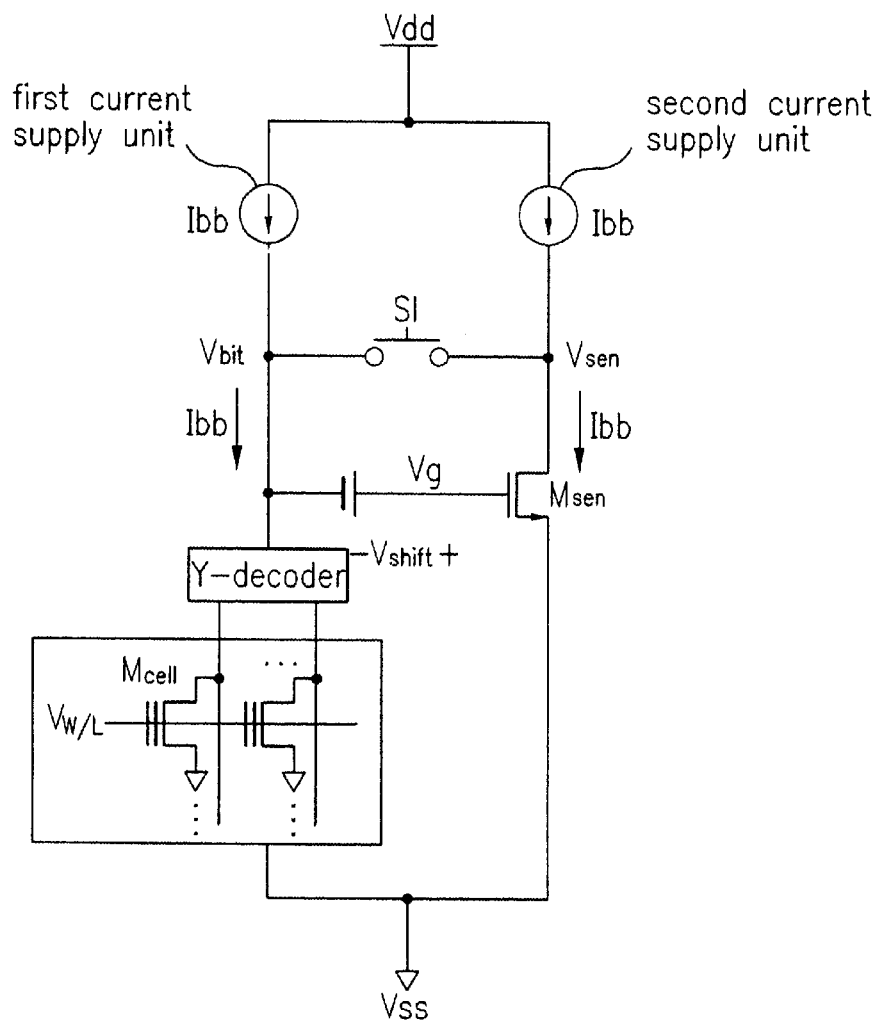
FIG. 7 illustrates a circuit when an erased, and a programmed cell are precharged.

Referring to FIG. 7, when the switch is turned off, the first, and second current supply units 34 and 35 are electrically separated, and identical current of Ibb flows through the bitline and the senseline. Firstly, if the erased cell is selected when the switch is turned off, current to the memory cell is reduced from 2Ibb to Ibb, and opposite to this. current to the sense MOS transistor is increased from 0 to Ibb. In this instance, as shown in FIG. 9a, since the bitline has a greater capacitance, the bitline voltage Vbit drops slowly. And, the gate voltage Vg of the sense MOS transistor Msen connected to the bitline through the voltage level shifter 32 is also reduced. And, the sensing node voltage Vsen rises sharply due to a small capacitance of the senseline. If the sensing node voltage Vsen is thus high, the memory cell is in an erased state. Secondly, if the programmed cell is addressed when the switch is turned off, current flowing through the memory cell increases from 0 to Ibb, and, opposite to this, current flowing through the sense MOS transistor Msen decreases from 2Ibb to Ibb. Accordingly, as shown in FIG. 9b, the bitline voltage Vbit rises gradually, and the sensing node voltage Vsen drops lower than a voltage in the precharge operation. According to the aforementioned sensing operation, it can be known that the memory cell is programmed.

Figure 8:
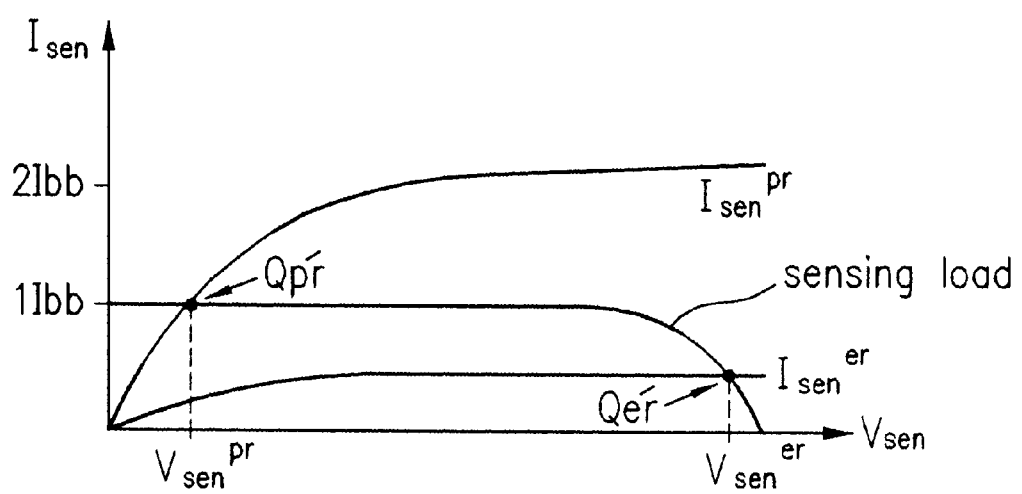
FIG. 8 illustrates a graph showing operation points of a circuit in the sensing operation.

FIG. 8 illustrates a graph showing operation points of a circuit in the sensing operation of an erased cell and a programmed cell. Each sensing operation point Qer' and Qpr' is a point at which a current-voltage characteristic curve and sensing load of an erased cell and a programmed cell cross, respectively. In the sensing operation of the erased cell, the sensing node voltage Vsener is significantly higher than a sensing node voltage Vsenpr of the programmed cell, and the voltage difference is greater than the bitline voltage difference of the erased cell and the programmed cell in the precharge operation.

Figure 10:
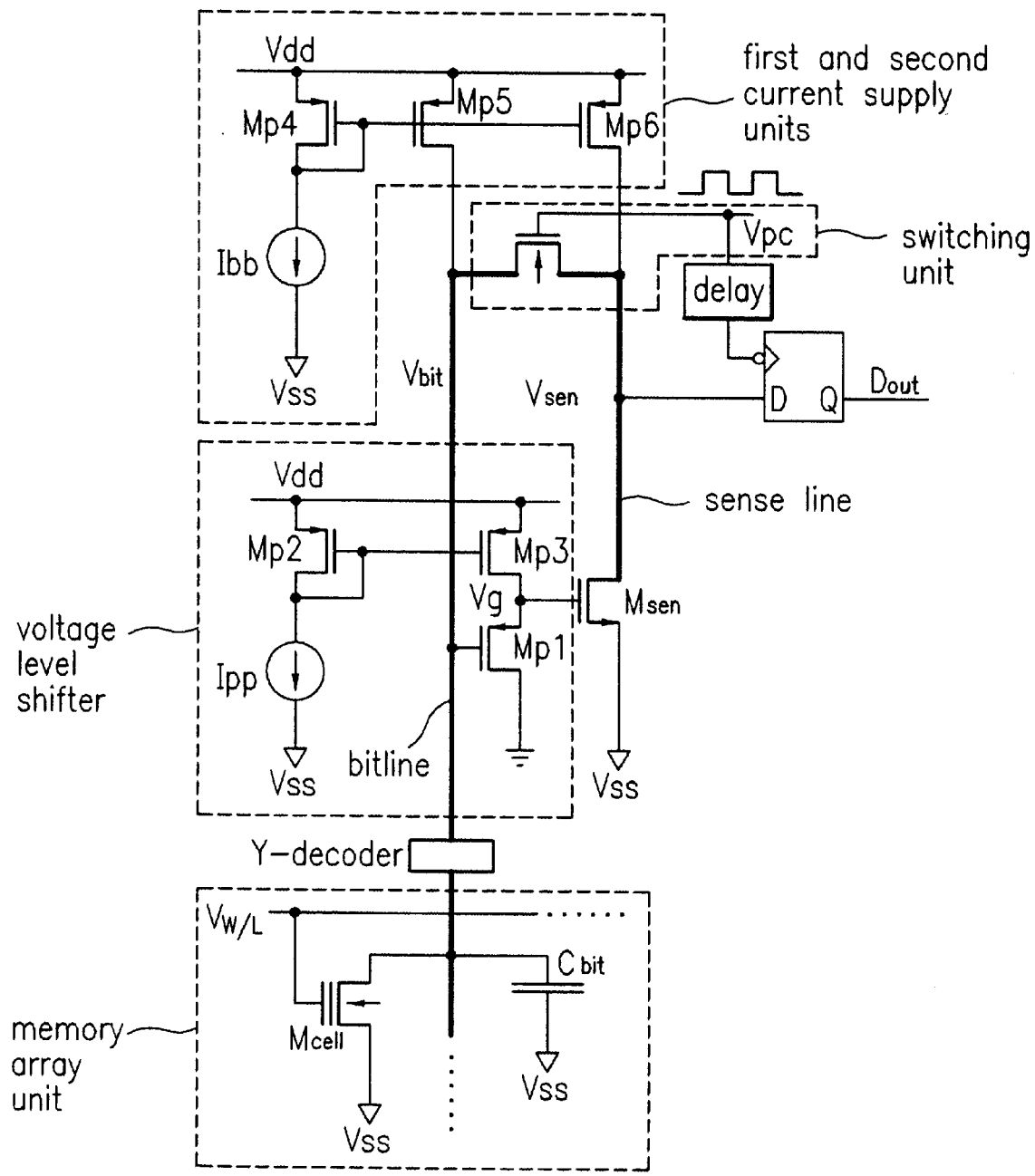

A sensing circuit for a semiconductor device having the present invention applied specifically thereto will be explained with reference to FIGS. 3 and 10. Systems of the present invention corresponding to blocks in FIG. 3 will be explained with reference to FIG. 10.

The memory array unit 31 in FIG. 3 has a plurality of memory cells Mcell each connected to a wordline and a bitline which has a large parasitic capacitor Cbit formed therein. The memory cell may be a nonvolatile flash EEPROM memory cell. And, the voltage level shifter 32 has a first, a second, and a third PMOS transistors Mp1, Mp2, and Mp3 and a first current source Ipp. The third, and first PMOS transistor Mp3 and Mp1 are connected in series between a power terminal Vdd and a ground terminal Vss, the first PMOS transistor Mp1 is applied of a bitline voltage, and the second PMOS transistor Mp2 is connected to the gate terminal of the third PMOS transistor. And, the second PMOS transistor Mp2 and the first current source Ipp are connected in series between the power source Vdd and ground terminal Vss, and a drain terminal and a gate terminal of the second PMOS transistor Mp2 are connected. In this instance, the second, and third PMOS transistors and the first current source are current mirrors, and the first PMOS transistor is a source follower. The first, and second current supply units 34 and 35 have a fourth, a fifth, and a sixth PMOS transistors Mp4, Mp5, and Mp6 and a second current source Ibb. The first current supply unit 34 has the fourth, and fifth PMOS transistors and the second current source Ibb, and the second current supply unit 35 has the fourth, and sixth PMOS transistor and the second current source Ibb. In the first current supply unit 34, the fourth PMOS transistor and the second current source Ibb are connected in series between the power source Vdd and the ground terminal Vss, and a gate terminal and a drain terminal of the fourth PMOS transistor are connected. The fourth, and fifth PMOS transistors have gate terminals connected to each other, and a drain terminal of the fifth PMOS transistor and the bitline is connected. Thus, the first current supply unit 34 serves as a current mirror which delivers an Ibb current to the bitline. The second current supply unit 35 shares the fourth PMOS transistor and the second current source Ibb with the first current supply unit 34, gate terminals of the sixth, and fourth PMOS transistors are connected, and a drain terminal of the sixth PMOS transistor is connected to the senseline. Thus, the second current supply unit 35 serves as a current mirror which delivers the Ibb current to the senseline. The switching unit 33 of an NMOS transistor is disposed between the drain terminal of the fifth PMOS transistor and the drain terminal of the sixth PMOS transistor, for switching between pre-charge and sensing. The sense MOS transistor Msen is of an NMOS transistor disposed between the sensing node SN and the ground terminal Vss, and has a gate terminal connected an output terminal of the voltage level shifter 32 between the first PMOS transistor and the third PMOS transistor. And, there are a delay for delaying a clock signal Vpc provided to the switching unit 33 for sensing a memory cell state, and a D flipflop for receiving, and inverting the clock signal delayed in the delay as a clock signal, receiving a state of sensing node SN through the senseline, and forwarding through an output terminal Dout according to the clock signal.

The sensing circuit for a semiconductor device and a sensing method using the same of the present invention as explained has the following advantages.

First, the prevention of great swing of charge/discharge of a bitline capacitance allows a reduction of power consumption and increased sensing speed.

Second, different from the related art, the unnecessity for a bitline voltage clamping coming from the varied, low bitline voltage allows to reduce a power consumption and prevent drop of a reliability caused by a soft programming.

Third, the simple, and small sized sensing circuit allows an easy application to a device of a high device packing density.

Fourth, the high stability to a varied voltage supply coming from a power supply of the sensing circuit using the current supply unit facilitates no drop of a sensing speed even at a low power supply, allowing application to a low voltage, low power, and fast nonvolatile memory.

It will be apparent to those skilled in the art that various modifications and variations can be made in the sensing circuit for a semiconductor device and a sensing method using the same of the present invention without departing from the spirit or scope of the invention. Thus, it is intended that the present invention cover the modifications and variations of this invention provided they come within the scope of the appended claims and their equivalents.

What is claimed is:

1. A sensing circuit for a semiconductor memory, comprising:
    a bitline connected to a drain terminal of a memory cell;
    a senseline, that senses and forwards a data in the memory cell;
    a switch that switches between the bitline and the senseline;
    a first current supply disposed between a power source and the bitline that supplies a current to the bitline to the memory cell;
    a second current supply disposed between the power source and the senseline that supplies a current to the senseline;
    a voltage level shifter that provides a voltage difference between the bitline and the senseline; and,
    a sense transistor disposed between the senseline and a ground voltage and having a gate terminal connected to one end of the voltage level shifter.

2. A sensing circuit as claimed in claim 1, wherein the gate terminal of the sense transistor is connected to a positive voltage terminal of the voltage level shifter.

3. A sensing circuit as claimed in claim 1, wherein each of the sense transistor and the switch includes an NMOS transistor.

4. A sensing circuit as claimed in claim 1, wherein each of the first, and second current supply includes a current mirror.

5. A sensing circuit as claimed in claim 4, wherein the first current supply includes;
    a first PMOS transistor having a source terminal connected to a power source terminal, and a gate terminal and a drain terminal connected to each other,
    a current source connected between the drain terminal of the first PMOS transistor and a ground terminal, and
    a second PMOS transistor having a source terminal connected to the power source terminal, a drain terminal connected to the bitline, and a gate terminal connected to the first PMOS transistor.

6. A sensing circuit as claimed in claim 5, wherein the second current supply includes;
    the first PMOS transistor the same as in the first current supply,
    the current source the same as in the first current supply, and
    a third PMOS transistor having a source terminal connected to the power source terminal, a drain terminal connected to the senseline, and a gate terminal connected to the first PMOS transistor.

7. A sensing circuit as claimed in claim 1, further comprising a D flip-flop that forwards a signal provided to the sensing node using a signal which is a delayed, and inverted clock signal provided to the switch as a clock signal.

8. A sensing method using a sensing circuit for a semiconductor memory comprising:

(1) applying a voltage to a selected memory cell at a wordline thereof;

(2) turning on a switch to connect a bitline to a senseline for precharging the bitline to the selected memory cell, wherein the precharging causes most of currents from first and second current sources to flow to the selected memory cell when a threshold voltage of the selected memory cell is low, and causes most of the currents from the first and second current sources to flow through the senseline when the threshold voltage of the selected memory cell is high; and, (3) turning off the switch for using a voltage change at a sensing node caused by a threshold voltage difference of the selected memory cell in sensing a data in the selected memory cell.

9. A sensing method as claimed in claim 8, wherein the precharge to the bitline utilizes a voltage difference between the bitline and the sensing node caused by a difference of currents to the bitline and the senseline coming from the threshold voltage of the selected memory cell.

10. A sensing method as claimed in claim 8, wherein, in the step (3), a voltage at the sensing node is high when a threshold voltage of the selected memory cell is low, and the voltage at the sensing node is low when the threshold voltage of the selected memory cell is high.

11. A sensing method as claimed in claim 9, wherein the currents through the senseline flow to a sense transistor.

12. A sensing method using a sensing circuit for a semiconductor memory comprising:

applying a voltage to a selected memory cell at a wordline thereof;

turning on a switch to connect a bitline to a senseline for precharging the bitline to the selected memory cell; and, turning off the switch for using a voltage change at a sensing node caused by a threshold voltage difference of the selected memory cell in sensing a data in the selected memory cell, wherein the precharging precharges the bitline and the senseline to one of a first voltage and a second voltage according to a threshold voltage of the selected memory cell.

13. The sensing method of claim 12, wherein the first voltage is higher than the second voltage.

14. The sensing method of claim 12, wherein the difference between the first and second voltages is caused by currents to the bitline and the senseline according to the threshold voltage of the selected memory cell when the selected memory cell is programmed or erased, respectively.

15. The sensing method of claim 12, wherein the precharging causes most of currents from first and second current sources to flow through the bitline to the selected memory cell when the threshold voltage of the selected memory cell is low, and causes most of the currents from the first and second current sources to flow through the senseline when the threshold voltage of the selected memory cell is high.

* * * * *